United States Patent
Tustaniwskyj et al.

(10) Patent No.: US 7,373,967 B1
(45) Date of Patent: May 20, 2008

(54) MECHANICAL ASSEMBLY, FOR REGULATING THE TEMPERATURE OF AN IC-CHIP, HAVING A GIMBALED HEAT-EXCHANGER WITH COILED SPRINGY CONDUITS

(75) Inventors: Jerry Ihor Tustaniwskyj, Mission Viejo, CA (US); Richard Scot McAuley, Newport Beach, CA (US); James Wittman Babcock, Escondido, CA (US)

(73) Assignee: Delta Design, Inc., Poway, CA (US)

( * ) Notice: Subject to any disclaimer, the term of this patent is extended or adjusted under 35 U.S.C. 154(b) by 453 days.

(21) Appl. No.: 10/879,245

(22) Filed: Jun. 28, 2004

(51) Int. Cl.
*F28F 7/00* (2006.01)
*F28D 15/00* (2006.01)
(52) U.S. Cl. ............................. 165/80.4; 165/104.33
(58) Field of Classification Search ........... 165/104.21, 165/104.26, 104.33
See application file for complete search history.

(56) References Cited

U.S. PATENT DOCUMENTS

| | | | | |
|---|---|---|---|---|
| 5,420,521 A | * | 5/1995 | Jones | ......................... 165/80.4 |
| 7,004,240 B1 | * | 2/2006 | Kroliczek et al. | ...... 165/104.33 |
| 2003/0051857 A1 | * | 3/2003 | Cluzet et al. | .......... 165/104.26 |
| 2004/0206479 A1 | * | 10/2004 | Kroliczek et al. | ...... 165/104.21 |

\* cited by examiner

*Primary Examiner*—Ljiljana Ciric
(74) *Attorney, Agent, or Firm*—Foley & Lardner LLP

(57) ABSTRACT

A mechanical assembly for regulating the temperature of an IC-chip in an IC-module includes: a) a heat-exchanger having a first face for contacting a second face on the IC-module; and b) a gimbal, coupled to the heat-exchanger, for tilting and pressing the first face flatly against the second face, as the first and second faces are moved from a spaced-apart position to an engaged position at which the IC-chip temperature is regulated. In addition, the mechanical assembly further includes an output tube, coupled to an output port on the heat-exchanger, which has two ends that move relative to each other as the first and second faces move from the spaced-apart position to the engaged position; and, this output tube is coiled into a weak spring which is characterized by a stiffness matrix that is limited by a predetermined acceptance criterion.

14 Claims, 9 Drawing Sheets eq. 1   MAX SLOPE OF TOP OF CHIP 10 = $\Delta\theta$ MAX = 2 1/2° eq. 2   ∴ MAX TILT OF 21b-2 FROM Z-AXIS = 2 1/2° eq. 3   LET P TO B1 = 3"

eq. 4   MAX B1 TO B2 ≈ (3")(2 1/2°)($\frac{\pi}{180°}$) = 130 MILS eq. 5   $\Delta$XB < 130 MILS eq. 6   $\Delta$ZB = 3/10" = 300 MILS

Figure 5 eq. 11   MAX TILT OF 21a-2 FROM X-Y PLANE = 2 1/2° eq. 12   LET P TO A1 = 3"

eq. 13   $\Delta$XA < $\Delta$XB < 130 MILS eq. 14   $\Delta$ZA ≈ $\Delta$ZB = 300 MILS

Figure 6

STEP 1   SELECT PARAMETERS THAT PHYSICALLY DEFINE COILED TUBE SECTION 21a-1 (OR 21b-1).

STEP 2   GENERATE 3D COMPUTER MODEL OF COILED TUBE DEFINED BY STEP 1

STEP 3   CALCULATE STIFFNESS MATRIX $S_M$

|  | $\Delta X = 1$ | $\Delta Y = 1$ | $\Delta Z = 1$ | $\Delta\theta X = 1$ | $\Delta\theta Y = 1$ | $\Delta\theta Z = 1$ |  |
|---|---|---|---|---|---|---|---|
| $F_X$ |  |  |  |  |  |  | 1 |
| $F_Y$ |  |  |  |  |  |  | 2 |
| $F_Z$ |  |  |  |  |  |  | 3 |
| $M_X$ |  |  |  |  |  |  | 4 |
| $M_Y$ |  |  |  |  |  |  | 5 |
| $M_Z$ |  |  |  |  |  |  | 6 |
|  | 1 | 2 | 3 | 4 | 5 | 6 |  |

*Figure 7A*

STEP 4    GENERATE "DISPLACEMENT VECTOR"

$$D_V = \begin{bmatrix} 130 \text{ MILS} \\ 130 \text{ MILS} \\ 300 \text{ MILS} \\ 2\ 1/2° \\ 2\ 1/2° \\ 1/2° \end{bmatrix} = \begin{bmatrix} \Delta X \text{ MAX} \\ \Delta Y \text{ MAX} \\ \Delta Z \text{ MAX} \\ \Delta \theta X \text{ MAX} \\ \Delta \theta Y \text{ MAX} \\ \Delta \theta Z \text{ MAX} \end{bmatrix}$$

STEP 5    CALCULATE "FORCE / MOMENT VECTOR"

$$FM_V = \begin{bmatrix} F_X \text{ MAX} \\ F_Y \text{ MAX} \\ F_Z \text{ MAX} \\ M_X \text{ MAX} \\ M_Y \text{ MAX} \\ M_Z \text{ MAX} \end{bmatrix} = \begin{bmatrix} S_M \end{bmatrix} \begin{bmatrix} D_V \end{bmatrix}$$

*Figure 7B*

STEP 6  TRANSFORM FORCES AND MOMENTS IN $FM_V$ TO FORCES AND MOMENTS ON IC-CHIP.

STEP 7  COMPARE $F_a$, $F_b$, $F_c$, $F_d$, $F_e$, M TO ACCEPTANCE CRITERION

STEP 8  IF ACCEPTANCE CRITERION NOT MET,
THEN: 1) ADJUST PARAMETERS IN STEP 1
 2) REPEAT STEPS 2-8 ative circuit chip (IC-chip), having a gimbaled heat-exchanger with coiled spring conduits. This mechanical assembly has use in electromechanical systems that test IC-chips.

MECHANICAL ASSEMBLY, FOR REGULATING THE TEMPERATURE OF AN IC-CHIP, HAVING A GIMBALED HEAT-EXCHANGER WITH COILED SPRINGY CONDUITS

RELATED CASES

The present invention is related to another invention, by the current inventors, which is entitled "Dual Feedback Control System For Maintaining The Temperature Of An IC-Chip Near A Set-Point". A patent application on this related invention was filed in the USPTO, on Feb. 16, 2004, and it is assigned Ser. No. 10/780,417. This related patent application is herein referred to as the '417 application.

BACKGROUND OF THE INVENTION

The present invention is a mechanical assembly, for regulating the temperature of an integrated circuit chip (IC-chip), having a gimbaled heat-exchanger with coiled spring conduits. This mechanical assembly has use in electromechanical systems that test IC-chips.

Today, a single state-of-the-art IC-chip can contain more than one-hundred-million transistors, and those transistors must be tested before the IC-chip is sold to a customer. Usually, each IC-chip is incorporated into an integrated circuit module (IC-module), and then the IC-chip in the IC-module is tested with a "burn-in" test, a "class" test, and a "system level" test. In one type of IC-module, the IC-chip is attached to a substrate and covered with a lid. In another type of IC-module, the IC-chip is attached to the substrate, but the IC-chip is not covered with any lid. In either case, electrical terminals are provided on the substrate which are connected by microscopic conductors in the substrate to the IC-chip.

The "burn-in" test thermally and electrically stresses the IC-chips to accelerate "infant mortality" failures. The stressing causes immediate failures that otherwise would occur during the first 10% of the IC-chips' life in the field, thereby insuring a more reliable product for the customer. The burn-in test can take many hours to perform, and the temperature of the IC-chip typically is held in the 90° C. to 140° C. range. Because the IC-chips are also subjected to higher than normal voltages, the power dissipation in the IC-chip can be significantly higher than in normal operation. This extra power dissipation makes the task of controlling the temperature of the IC-chip very difficult. Further, in order to minimize the time required for burn-in, it is also desirable to keep the temperature of the IC-chip as high as possible without damaging the IC-chip.

The "class" test usually follows the burn-in test. Here, the IC-chips are speed sorted and the basic function of each IC-chip is verified. During this test, power dissipation in the IC-chip can vary wildly as the IC-chip is sent a stream of test signals. Because the operation of an IC-chip slows down as the temperature of the IC-chip increases, very tight temperature control of the IC-chip is required throughout the class test. This insures that the speed at which the IC-chip operates is measured precisely at a specified temperature. If the IC-chip temperature is too high, the operation of the IC-chip will get a slower speed rating. Then the IC-chip will be sold as a lower priced part.

The "system level" test is the final test. Here, the IC-chips are exercised using software applications which are typical for a product that incorporates the IC-chips. In the system level test, the IC-chips are tested over a temperature range that can occur under normal operating conditions, i.e. approximately 20°-80° C.

In the '417 application, FIG. 1 shows an entire control system for maintaining the temperature of an IC-chip near a set-point while the above tests are performed. That FIG. 1 system includes an electric heater, an evaporator, an input conduit, and an output conduit, all of which are connected together to form one heat-exchanger. The present invention is a mechanical assembly which constitutes a novel physical implementation of the heat-exchanger.

For ease of reference, FIG. 1 of the '417 application is reproduced here as FIG. 1. Also, TABLE 1 from the '417 application, which identifies all of the components in FIG. 1, is reproduced below.

TABLE 1

| Component | Description |
|---|---|
| 20 | Component 20 is a thin, flat electric heater. The heater 20 has one flat face which contacts the IC-chip 10, and it has an opposite flat face which is connected directly to component 21. Electrical power $P_H$ is sent to the heater 20 on conductors 20a. The temperature of the heater 20 is detected by a sensor 20b in the heater 20. This temperature is indicated by a signal $ST_H$ on conductors 20c. |
| 21 | Component 21 is an evaporator for a refrigerant. The refrigerant enters the evaporator 21 in a liquid state through a conduit 21a, and the refrigerant exits the evaporator 21 in a gas state through a conduit 21b. The temperature of the evaporator 21 is detected by a sensor 21c on the exterior of the evaporator. This temperature is indicated by a signal $ST_E$ on conductors 21d. |
| 22 | Component 22 is a valve which receives the refrigerant in a liquid state from a conduit 22a, and which passes that refrigerant at a selectable flow rate to the conduit 21a. The flow rate through the valve 22 is selected by a control signal $SF_V$ on conductors 22b. In one embodiment, the signal $SF_V$ is a pulse modulated signal, and the valve 22 opens for the duration of each pulse. In another embodiment, the signal $SF_V$ is an amplitude modulated analog signal, and the valve 22 opens to a degree that is proportional to the amplitude of the signal. |

TABLE 1-continued

| Component | Description |
|---|---|
| 23 | Component 23 is a compressor-condenser which has an input that is connected to conduit 21b, and an output that is connected to conduit 22a. The compressor-condenser 23 receives the refrigerant in the gas state, and then compresses and condenses that refrigerant to the liquid state. |
| 24 | Component 24 is a socket which holds the substrate 11. Electrical conductors 24a, 24b and 24c pass through the socket to the IC-chip 10. The conductors 24a carry test signals to and from the IC-chip 10. The conductors 24b carry electrical power $P_C$ to the IC-chip 10. The conductors 24c carry signals $ST_C$ which indicate the temperature of the IC-chip 10. These signals $ST_C$ are generated by a temperature sensor 10a that is integrated into the IC-chip 10. |
| 25 | Component 25 is a power supply which sends the power $P_H$ to the electric heater 20 with a selectable magnitude. The amount of power that is sent at any instant is selected by a signal $SP_H$ on conductors 25a. |
| 26 | Component 26 is a control circuit for the heater power supply 25. This control circuit 26 generates the signal $SP_H$ on the conductors 25a in response to the signals $ST_E$, $ST_H$, $ST_C$, and SP which it receives on the conductors 21d, 20c, 24c and 26a. The signal SP indicates a set-point temperature at which the IC-chip 10 is to be maintained. The control circuit 26, together with the power supply 25 and the electric heater 20, form a first feedback loop in the FIG. 1 control system. This first feedback loop quickly compensates for changes in power dissipation in the IC-chip 10 and thereby maintains the temperature of the IC-chip 10 near the set-point. |
| 27 | Component 27 is a control circuit for the valve 22. This control circuit 27 generates the signal $SF_V$ on the conductors 22b in response to the signals $SP_H$, $ST_E$, and SP which it receives on the conductors 25a, 21d, and 26a. The control circuit 27, together with the valve 22 and the evaporator 21, form a second feedback loop in the FIG. 1 control system. This second feedback loop passes the liquid refrigerant through the evaporator with a variable flow rate that reduces the overall usage of electrical power in the FIG. 1 system. |

In the '417 application, the invention focuses on the first and second feedback loops which are identified in TABLE 1 under components 26 and 27. With those two feedback loops, the temperature of the IC-chip is maintained near the set-point, and the overall power usage in the FIG. 1 system is greatly reduced. This is achieved independently of any particular physical implementation of the heat-exchanger components 20, 21, 21a, and 21b.

By comparison, the present invention focuses entirely on a physical implementation for the heat-exchanger components 20, 21, 21a, and 21b. With this physical implementation, certain interface problems are avoided which can occur at the pressed joint between the electric heater 20 and the IC-chip 10. These interface problems are described herein in the BRIEF SUMMARY OF THE INVENTION and the DETAILED DESCRIPTION.

Accordingly, a primary object of the present invention is to provide a mechanical assembly, which is a heat-exchanger for controlling the temperature of an IC-chip, having a novel physical structure which overcomes the above interface problems.

BRIEF SUMMARY OF THE INVENTION

The present invention is a mechanical assembly for regulating the temperature of an IC-chip in an IC-module. This mechanical assembly is of the type that includes: a) a heat-exchanger having a first face for contacting a second face on the IC-module; and b) a gimbal coupled to the heat-exchanger, for tilting and pressing the first face flatly against the second face, as the first and second faces are moved from a spaced-apart position to an engaged position.

In one preferred embodiment, this mechanical assembly also includes a coiled input tube and a coiled output tube. The coiled input tube has one end coupled to an input port on the heat-exchanger and has another end coupled to a source for a coolant. The coiled output tube has one end coupled to an output port on the heat-exchanger and has another end coupled to return the coolant to the source. In this preferred embodiment, the coiled input tube and the coiled output tube are springs which are so weak that their one end can move relative to their other end without exerting any significant force or torque on the heat-exchanger as the first and second faces move from the spaced-apart position to the engaged position. To achieve this, each spring has a respective stiffness matrix that is limited by a pre-determined acceptance criterion.

If the input tube and/or the output tube are not coiled, those tubes can be so stiff that they will prevent the first face of the heat-exchanger from always lying flatly against the second face of the IC-chip. When those two faces do not lie flatly against each other the thermal resistance between those two faces will increase. But as that thermal resistance increases, the ability of the heat-exchanger to regulate the temperature of the IC-chip is degraded.

The above interface problem is most severe when the heat-exchanger includes an evaporator for the coolant, and the coolant in the input tube is in a liquid state whereas the coolant in the output tube is in a gas state. In that case, the tubes must be strong enough to withstand coolant pressures which occur in refrigeration systems. The coolant pressure in the input tube is typically at least 100 psi more than the coolant pressure in the output tube when the system is operating, and the coolant pressure in both tubes is typically at least 50 psi when the system is off. One candidate for handling such pressures is tubes which have metal walls, but such metal-walled tubing is stiff.

In addition, to ensure that the gas in the output tube is at low pressure, the output tube needs to have a large diameter. In one embodiment, the diameter of the output tube is one-quarter of an inch, whereas the diameter of the input tube is only one-sixteenth of an inch. Preferably, the diameter of the output tube is at least twice the diameter of the input tube, but this large diameter also tends to make the output tube stiff.

BRIEF DESCRIPTION OF THE DRAWINGS

FIG. 5 is a set of equations which define certain limits for the movements of the ends of the coiled spiral tube in the heat-exchanger of FIG. 2.

FIG. 6 is a set of equations which define certain limits for the movements of the ends of the coiled cylindrical tube in the heat-exchanger of FIG. 2.

FIG. 7A shows the first three steps of an eight step process by which physical parameters are determined for the two coiled tubes in the heat-exchanger of FIG. 2.

FIG. 7B shows the next two steps of an eight step process by which physical parameters are determined for the two coiled tubes in the heat-exchanger of FIG. 2.

DETAILED DESCRIPTION

Figure 2:
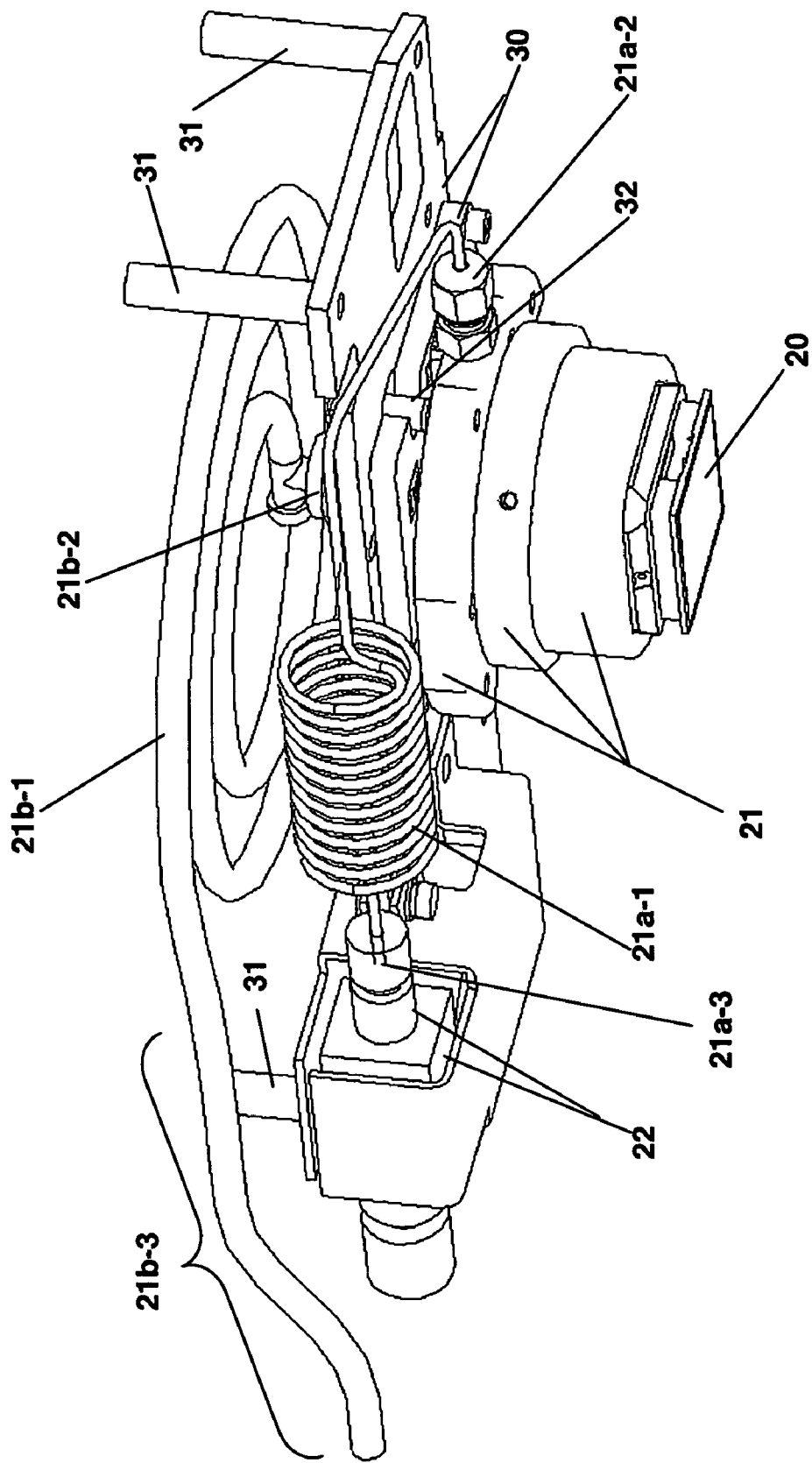
FIG. 2 shows a three-dimensional view of one preferred physical implementation for the heat-exchanger in the FIG. 2 control system.

To begin this Detailed Description, reference should now be made to FIG. 2. There, a mechanical assembly is shown which is one preferred embodiment of the present invention.

Figure 1:
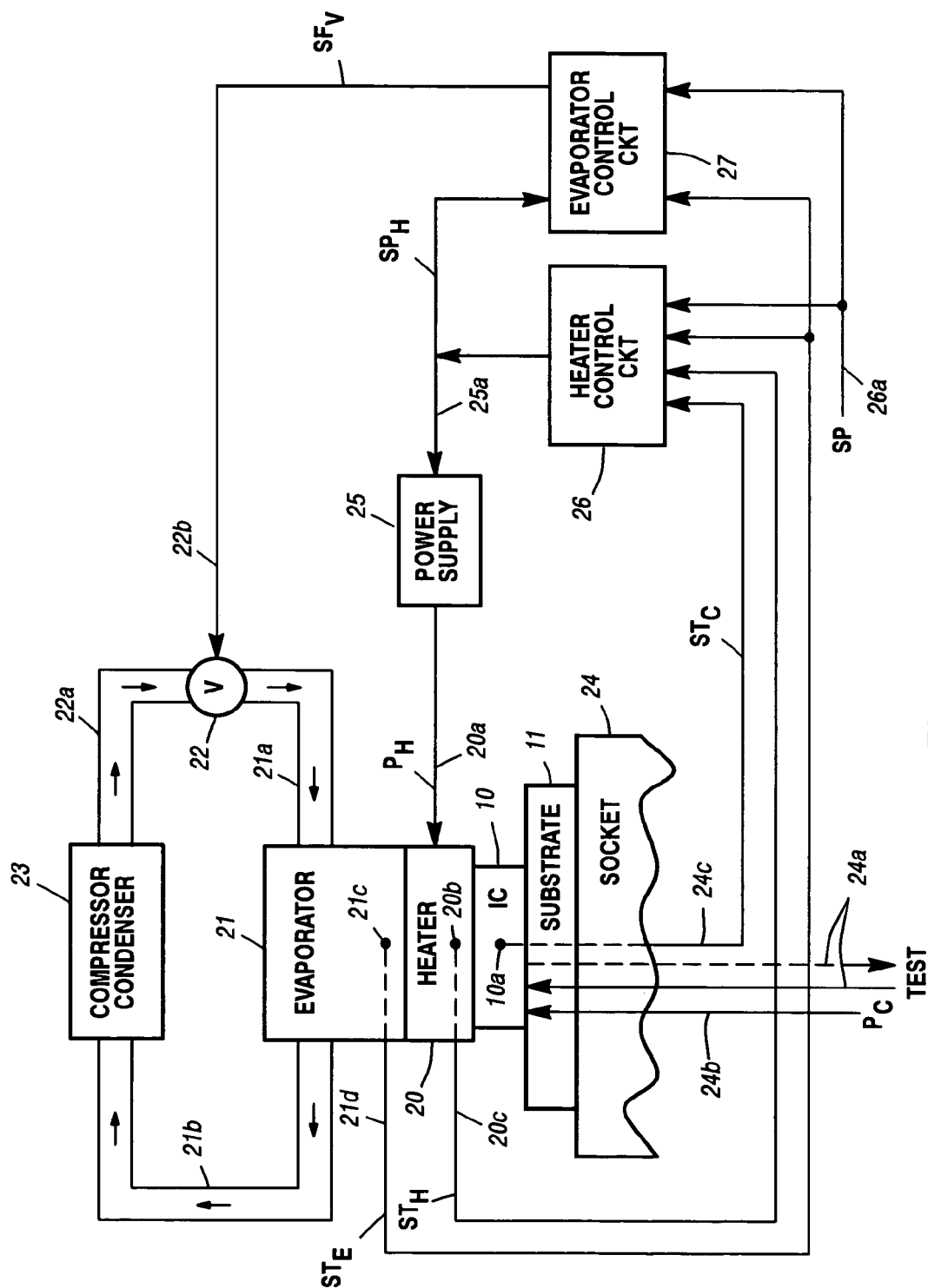
FIG. 1 shows a control system, for maintaining the temperature of an IC-chip near a set-point, which includes a heat-exchanger that is the subject of the present invention.

In FIG. 2, item 20 is a physical implementation of the electric heater 20 that is shown schematically in FIG. 1. Also, item 21 in FIG. 2 is a physical implementation of the evaporator 21 that is shown schematically in FIG. 1. Further, item 22 in FIG. 2 is a physical implementation of the control valve 22 that is shown schematically in FIG. 1.

Items 21a-1, 21a-2, and 21a-3 in FIG. 2 together constitute a physical implementation of the input conduit 21a that is shown schematically in FIG. 1. Item 21a-1 is the central portion of the conduit 21a. This central portion 21a-1 is a tube which is coiled into a cylindrical spring. One end 21a-2 of this cylindrically coiled tube 21a-1 connects to an input port on the evaporator 21, and the opposite end 21a-3 connects to an output port on the control valve 22.

Similarly, items 21b-1, 21b-2, and 21b-3 in FIG. 2 together constitute a physical implementation of the output conduit 21b that is shown schematically in FIG. 1. Item 21b-1 is the central portion of the conduit 21b. This central portion 21b-1 is a tube which is coiled into a spiral spring. One end 21b-2 of this spiral coiled tube 21b-1 connects to an output port on the evaporator 21, and the opposite end 21b-3 connects to the compressor/condenser 23 (shown in FIG. 1 but not shown in FIG. 2).

Figure 3A:
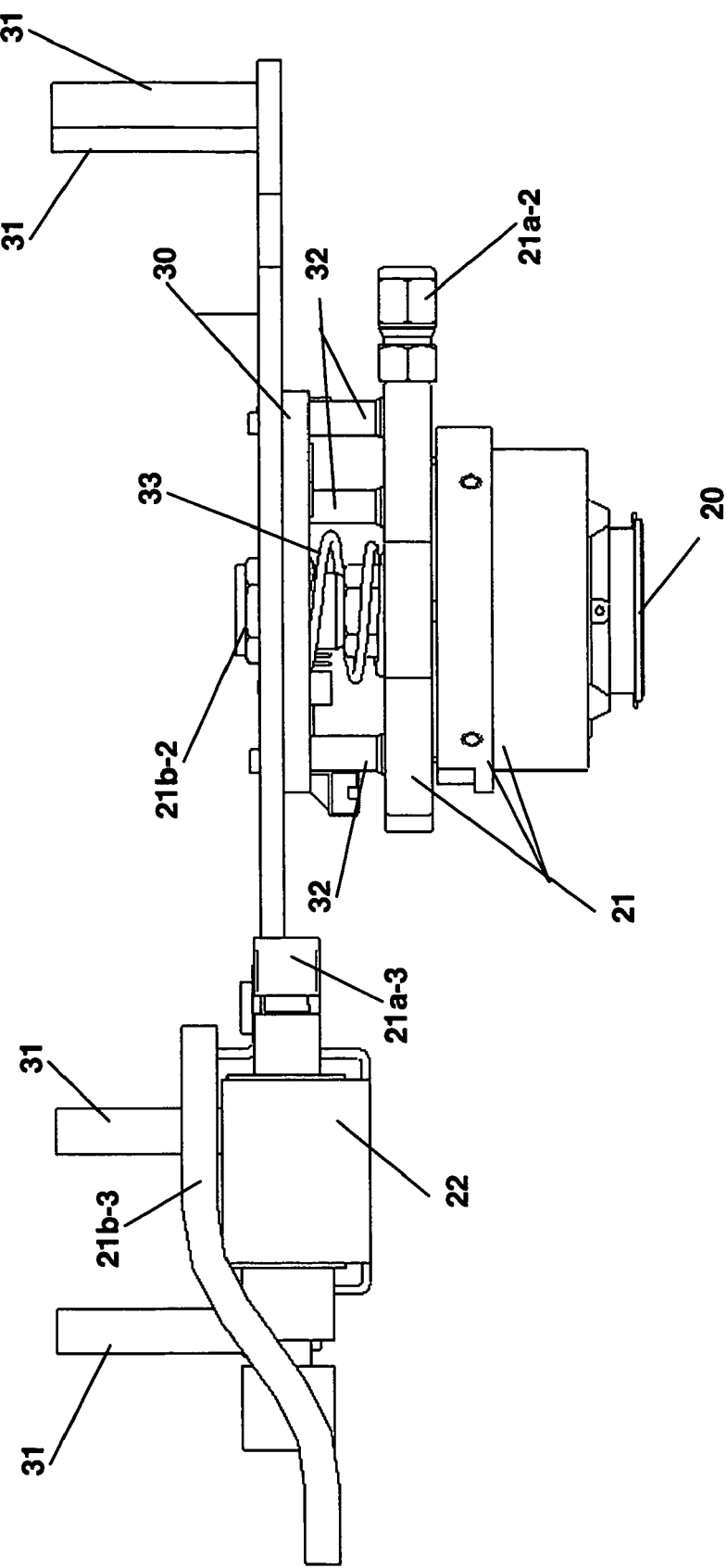
FIG. 3A shows a side view of certain parts in the heat-exchanger of FIG. 2, when that heat-exchanger is spaced-apart from (and not pressing against) an IC-chip.
Figure 3B:
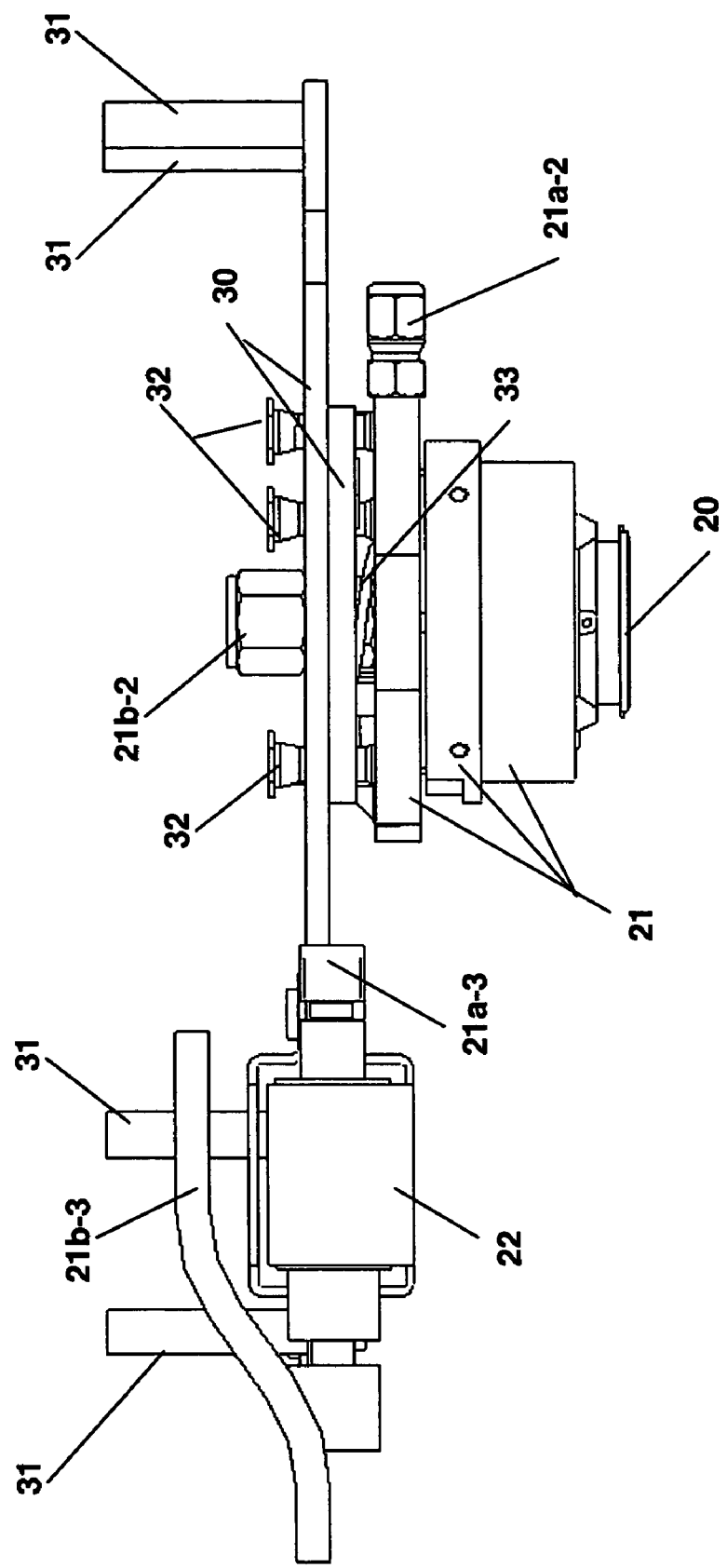
FIG. 3B shows a side view of certain parts in the heat-exchanger of FIG. 2, when that heat-exchanger is pressing against an IC-chip.

Further in FIG. 2, items 30, 31, and 32 together constitute a portion of a gimbal. Other parts of this gimbal are hidden from view in FIG. 2, but they are shown in FIGS. 3A and 3B. Note that in FIGS. 3A and 3B, the springy central section 21a-1 of the input conduit 21a and the springy central section 21b-1 of the output conduit 21b are not shown because they would hide the gimbal.

Item 30 is a base plate in the gimbal. Four support legs 31 are connected to the upward facing surface of the base plate 30. The open ends of these support legs 31 can be connected to a stationary frame if a mechanism is provided which moves the socket 24 for the IC-chip 10 up and down. Alternatively, the open ends of the support legs 31 can be connected to a mechanism which moves those legs up and down if the socket 24 for the IC-chip 10 is held stationary.

The output port on the evaporator 21 passes loosely through a central hole (not shown) in the base plate 30 and connects to end 21b-2 of the spiral coiled tube 21b-1. Also, three guides 32 respectively pass through three additional holes (not shown) in the base plate 30 which are spaced around the central hole. These guides 32 are best seen in FIGS. 3A and 3B.

Each guide 32 slides loosely in its corresponding hole. One end of each guide is attached to the evaporator 21. The opposite end of each guide 32 is open and has a flange which tapers outward. This tapered flange stops the guide from passing through its hole and centers the guide in its hole.

Item 33 is a cylindrically coiled spring which is hidden in FIG. 2, but which is seen in FIGS. 3A and 3B. The output port of the evaporator 21 passes loosely through the coils of the spring 33. One end of the spring 33 presses against the base plate 30, and the opposite end of the spring 33 presses against the evaporator 21.

Consider now how all of the components in the FIG. 2 mechanical assembly move, as that assembly is used to regulate the temperature of IC-chips in the system of FIG. 1. When any one IC-chip 10 is being tested, the heater 20 must lie flat against that chip. If the heater 20 and the IC-chip 10 are at a slight angle with respect to each other, then the thermal resistance between the heater 20 and the IC-chip 10 will be so large that the first and second feedback loops in the FIG. 1 system (which were identified in the Background) will not work properly.

After the testing of any one IC-chip 10 is completed, the heater 20 and the IC-chip 10 must then be separated. This enables the IC-chip 10 which was just tested to be removed, on its substrate 11, from the socket 24. Then the next IC-chip 10 that is to be tested can be inserted, on its substrate 11, into the socket 24.

Each time another IC-chip 10 on its substrate 11 is inserted into the socket 24, the surface of the IC-chip 10 which needs to lie flat against the heater 20 will have a slightly different orientation due to various tolerances. For example, variation in height across the IC-chip 10 can occur. Also, variation in height in the attachment of the IC-chip 10 to its substrate 11 can occur.

To accommodate the different orientations of the IC-chip 10, the heater 20 in FIG. 2 is attached to the evaporator 21 which in turn is attached to the gimbal 30-33. However, the evaporator 21 is also attached to the input conduit 21a and the output conduit 21b, and those conduits will impede the movement of the gimbal 30-33 if they are too stiff. But this stiffness problem is completely avoided by the springy cylindrical coil 21a-1 and the spring spiral coil 21b-1.

When the heater 20 and the IC-chip 10 are spaced apart, the components in the FIG. 2 assembly are positioned as shown in FIG. 3A. There, spring 33 in the gimbal pushes the evaporator 21 away from the base plate 30 until the tapered ends of the guides 32 hit the base plate. In FIG. 3A, the two ends 21a-2 and 21a-3 of the input conduit 21a are separated by a maximum distance. Likewise in FIG. 3A, the two ends 21b-2 and 21b-3 of the output conduit 21b are separated by a maximum distance.

By comparison, when the heater 20 is pressed flatly against the IC-chip 10, the components in the FIG. 2 assembly are positioned as shown in FIG. 3B. There, spring 33 in the gimbal is compressed by the IC-chip 10 (not shown) which is being pressed against the heater 20. It is this spring 33 that provides the nominal contact force for the thermal interface between the IC-chip 10 and the heater 20. This force by the spring 33 must be large enough to ensure a low thermal resistance, but small enough to not damage the IC-chip. It is because this force cannot be arbitrarily large that any forces or torques exerted by the input and output conduits 21a and 21b must be limited.

As the spring 33 is compressed, the tapered ends of the guides 32 move above the base plate 30. That allows the evaporator 21 and the attached heater 20 to tip and thereby lie flat against the IC-chip 10. In FIG. 3B, the two ends 21a-2 and 21a-3 of the input conduit 21a are closer together than they are in FIG. 3A. Also in FIG. 3B, the two ends 21b-2 and 21b-3 of the output conduit 21b are closer together than they are in FIG. 3A.

Figure 4:
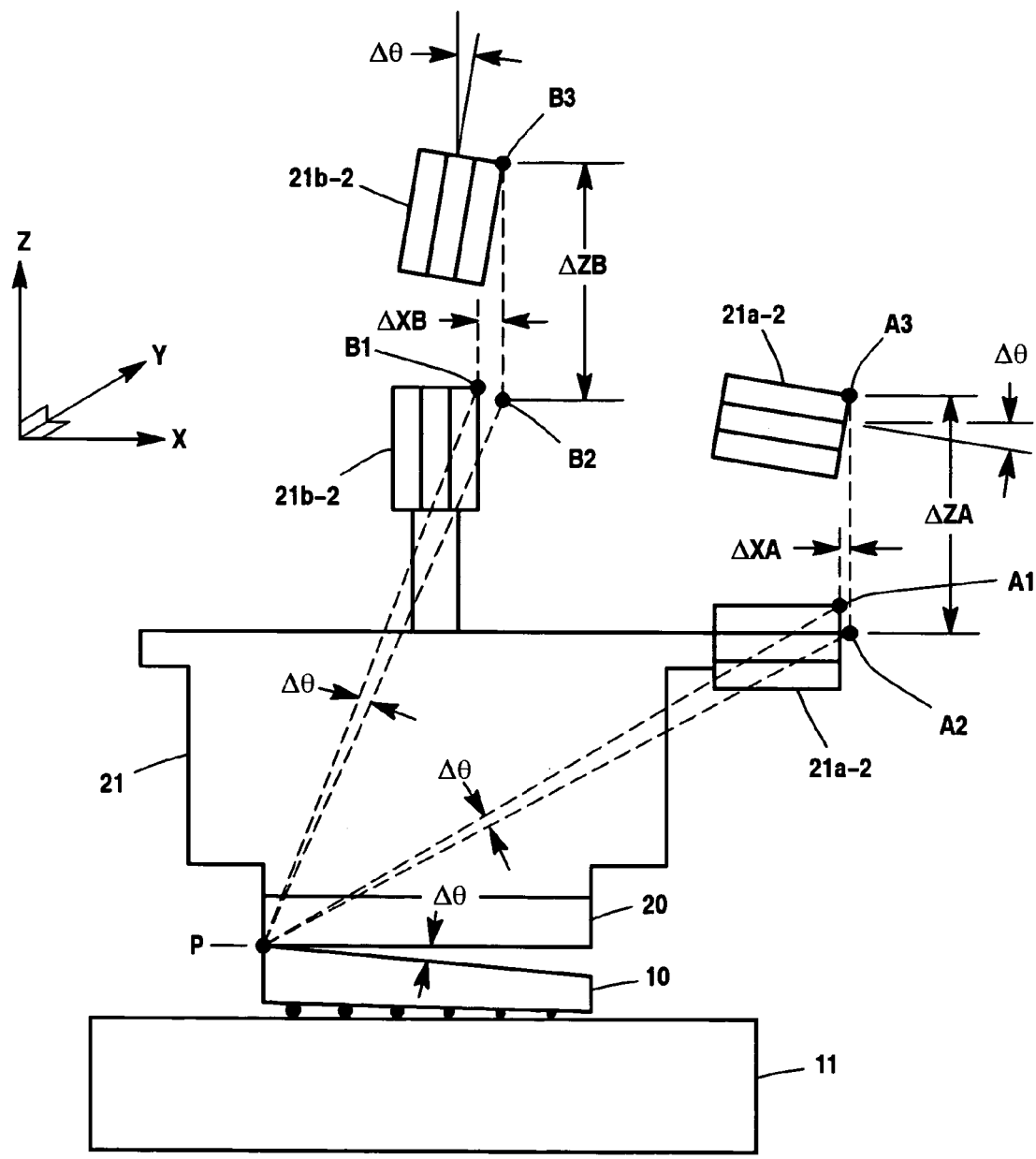
FIG. 4 illustrates various movements which are made by the ends of two coiled tubes in the heat-exchanger of FIG. 2.

To analyze the movement of the conduit ends 21a-2 and 21b-2 in more detail, reference should now be made to FIG. 4. There, the evaporator 21 and the heater 20 are shown at the instant where the heater 20 makes initial contact with the IC-chip 10. This initial contact occurs at one point "P" because, due to tolerances, the top surface of the IC-chip 10 is at a slight angle $\Delta\theta$ with respect to the contact surface of the heater 20.

As the IC-chip 10 and the heater 20 are pressed together, the previously described gimbal 30-33 enables the heater 20 and the evaporator 21 to tip until the contact surface of the heater 20 lies flat against the top surface of the IC-chip 10. Thus, the heater 20 and the evaporator 21 rotates on point P by the angle $\Delta\theta$.

During the above rotation, point A1 on end 21a-2 of the input conduit 21a moves to point A2. This movement occurs relative to the opposite end 21a-3 of the input conduit 21a. Similarly during the above rotation, point B1 on end 21b-2 of the output conduit 21b moves to point B2. This movement occurs relative to the opposite end 21b-3 of the output conduit 21b.

Thereafter, as the IC-chip 10 and the heater 20 are pressed together with additional force, the spring 33 in the previously described gimbal 30-33 gets compressed. Thus the conduit ends 21a-2 and 21b-2 move upward relative to their opposite ends 21a-3 and 21b-3. In FIG. 4, point A2 on the conduit end 21a-2 moves vertically to point A3, and point B2 on the conduit end 21b-2 moves vertically to point B3.

Equation 1 of FIG. 5 gives a practical numerical value for the maximum angle between the top of the IC-chip 10 and the contact face of the heater 20, when the heater 20 initially touches the IC-chip 10 at point P as shown in FIG. 4. This angle "$\Delta\theta$ MAX" is set by equation 1 to 2.5°.

After the heater 20 has rotated on point P by 2.5° in order to lie flat against the IC-chip 10, end 21b-2 of the output conduit 21b will tilt 2.5° from the vertical axis Z. This is stated by equation 2 in FIG. 5. This tilt can be visualized in FIG. 4 as point B1 moves to point B2.

Equation 3 of FIG. 5 gives a practical numerical value for the distance from point P in FIG. 4 to point B1. This distance is set by equation 3 to three inches.

Based on equations 2 and 3, the straight line distance from point B1 to point B2 can be approximated, as shown by equation 4. In equation 4, the product of "3 inches" times "2.5° in radians" equals the length of an arc from point B1 to point B2. The length of that arc approximately equals the straight line distance from point B1 to point B2 because the angle of 2.5° is so small.

In equation 5, the term $\Delta XB$ is the distance from point B1 to point B2 in the horizontal plane X-Y. This distance $\Delta XB$ is slightly smaller than the straight line distance from point B1 to point B2 because a straight line from point B1 to point B2 is at small angle with the horizontal plane. Thus equation 5 says $\Delta XB$ is less than the 130 mils that was calculated by equation 4.

Equation 6 of FIG. 5 gives a practical numerical value for distance from point B2 in FIG. 4 to point B3. This distance $\Delta ZB$ is set by equation 6 to three tenths of one inch, or three-hundred mils.

The three values of 2.5° in equation 2, 130 mils in equation 5, and 300 mils in equation 6 together define three limits for how far end 21b-2 might move, relative to the opposite end 21b-3 of the output conduit 21b. However, due to symmetry in FIG. 4, the rotation of 2.5° might occur around the X-axis and the Y-axis. A smaller rotation of 0.5° might occur around the Z-axis. Also in FIG. 4, the horizontal movement $\Delta XB$ might occur on both the X-axis and the Y-axis. Thus, end 21b-2 of the output conduit 21b has a total of six degrees of freedom (three translational in directions X, Y and Z and three rotational about any of these three axes).

Next, in FIG. 6, equation 11 says that end 21a-2 of the input conduit 21 tilts from the horizontal plane (X-Y plane) by a maximum angle of 2.5°. This is deduced from equations 1 and 2 of FIG. 5, and from the geometries of FIG. 4.

Equation 12 of FIG. 6 gives a practical numerical value for the distance from point P in FIG. 4 to point A1. This distance is set by equation 12 to three inches.

In FIG. 4, point A1 on end 21a-2 moves to point A2 when point B1 on end 21B-2 moves to point B2. But end 21b-2 moves further in the X-Y plane than end 21a-2. This is stated by the left side of equation 13. Further, a limit for $\Delta XB$ was previously calculated by equation 5 to be less than 130 mils, and this value is given on the right side of equation 13.

Equation 14 of FIG. 6 gives an approximate numerical value for the distance from point A2 in FIG. 4 to point A3. This distance $\Delta ZA$ is approximately equal to $\Delta ZB$ that is given by equation 6.

The three values of 2.5° in equation 11, 130 mils in equation 13, and 300 mils in equation 14 together define three limits for how far end 21a-2 might move, relative to the opposite end 21a-3 of the output conduit 21a. But again, due to symmetry in FIG. 4, the rotation of 2.5° might occur around the X-axis and the Y-axis. The smaller rotation of 0.5° might again occur around the Z-axis. Also in FIG. 4, the horizontal movement ΔXA might occur on both the X-axis and the Y-axis. So end 21a-2 of the input conduit 21a also has six degrees of freedom.

When the two conduit ends 21a-2 and 21b-2 move as described above, those conduit ends must not exert any significant interfering force or torque on the evaporator 21. FIGS. 7A-7B illustrate an eight step process for designing the coiled central portion 21a-1 of the input conduit 21a, and the coiled central portion 21b-1 of the output conduit 21b, such that this criterion is met. The details of that process will now be described.

In step 1, a set of parameters are selected which define the physical structure of the coils in one of the tube portions 21a-1 or 21b-1. This step is illustrated in FIG. 7A. There, the parameters which are selected are: 1) the total number of coils, 2) a radius for each coil (in the case of a cylindrical coil) or a minimum radius plus a rate of change for the radius. (in the case of a spiral coil), 3) an outside diameter for the tube which makes up the coils, 4) a thickness for the tube sidewalls, and 5) the material of which the tube is made.

Next, in step 2, a three-dimensional model is generated in a computer of the coiled section 21a-1 (or 21b-1) that was defined by step 1. To generate this model, a computer-aided-design program is used. One such program, called "ProEngineer", is commercially available from Parametric Technology Corporation.

Next, in step 3, a "stiffness matrix" $S_M$ is produced for the coiled section 21a-1 (or 21b-1) that is being modeled. This stiffness matrix $S_M$, which is illustrated in FIG. 7A, has a total of six rows and six columns.

In the stiffness matrix $S_M$, a separate column is provided for each degree of freedom with which end 21a-2 (or 21b-2) can move in FIG. 4. Columns 1, 2, and 3 are provided for linear movement which respectively occurs parallel to the X, Y, and Z axis in FIG. 4. Columns 4, 5, and 6 are provided for rotational movement which respectively occurs around the X, Y, and Z axis in FIG. 4.

To determine all of the entries in column 1 of the stiffness matrix, end 21a-2 (or end 21b-2) of the coiled tube that is modeled is deflected in the "X" direction by one unit (e.g. —by one inch) while holding all other displacements and rotations fixed at zero. For that deflection to occur, three forces ($F_x$, $F_y$, and $F_z$) and three moments ($M_x$, $M_y$, and $M_z$) must be applied to the deflected end. The forces $F_x$, $F_y$, and $F_z$ respectively occur parallel to the X, Y, and Z axis in FIG. 4, and those forces are entered into the stiffness matrix in rows 1, 2, and 3 of column 1. The moments $M_x$, $M_y$, and $M_z$ respectively occur around the X, Y, and Z axis in FIG. 4, and they are entered into the stiffness matrix in rows 4, 5, and 6 of column 1.

All of the entries in any other column of the stiffness matrix are generated in a similar fashion. For example, to generate the entries for column 4, end 21a-2 (or end 21b-2) of the modeled coiled tube is rotated by one unit (e.g. —one degree) around the X-axis in FIG. 4 while holding all other displacements and rotations fixed at zero. Then, the forces ($F_x$, $F_y$, and $F_z$) and moments ($M_x$, $M_y$, and $M_z$) which must be applied to the rotated end to cause the rotation are entered into rows 1-6 of column 4.

To calculate the numerical values of all of the forces and moments which get entered into the stiffness matrix, a computer program for performing finite element stress analysis is used. One such program, called "Pro/Mechanica", is available from Parametric Technology Corporation. The input to Pro/Mechanica is the 3D model from ProEngineer.

Next, in step 4, a "displacement vector" $D_v$ is generated which defines the maximum displacements that occur in all six degrees of freedom for end 21a-2 (or 21b-2) in FIG. 4. This displacement vector, which is illustrated in FIG. 7B, has six rows and one column. Rows 1, 2, and 3 respectively are the maximum movements for end 21a-2 (or 21b-2) in FIG. 4 which can occur in the X, Y, and Z directions. Rows 4, 5, and 6 respectively are the maximum angular movements for end 21a-2 (or end 21b-2) in FIG. 4 which can occur around the X, Y, and Z axis. These entries in rows 1-6 were previously determined by equations 1-6 of FIG. 5 and equations 11-14 of FIG. 6.

Next, in step 5, the displacement vector $D_v$ and the stiffness matrix $S_M$ are multiplied together. This produces a force/moment vector $FM_v$, as shown in FIG. 7B, which has six rows and one column. The entries in rows 1, 2, and 3 respectively are the maximum forces in the X, Y, and Z directions which are asserted by end 21a-2 (or end 21b-2) on the input port (or output port) of the evaporator 21 in FIG. 4. The entries in rows 4, 5, and 6 respectively are the maximum moments around the X, Y, and Z axis which are asserted by end 21a-2 (or end 21b-2) on the input port (or output port) of the evaporator 21 in FIG. 4.

If one of the coiled tube sections 21a-1 or 21b-1 is much stiffer than the other, then as a simplification, the above described steps 1-5 need only be performed on the stiffer section. Otherwise, the above described steps 1-5 need to be performed separately on each of the coiled tube sections 21a-1 and 21b-1. Then the forces and moments which each of the coiled tubes sections exert on the evaporator 21, as determined by step 5, are added together.

Next, in step 6, one moment "M" and five forces "$F_a$", "$F_b$", "$F_c$", "$F_d$", and "$F_e$" are calculated which the evaporator 21 exerts on the IC-chip 10. The moment M occurs around an axis which is perpendicular to the contact surface of the IC-chip 10. Each of the forces $F_a$, $F_b$, $F_c$, and $F_d$ occur perpendicular to the contact surface of the IC-chip 10. The force $F_e$ occurs parallel to the contact surface of the IC-chip 10.

Figure 7C:
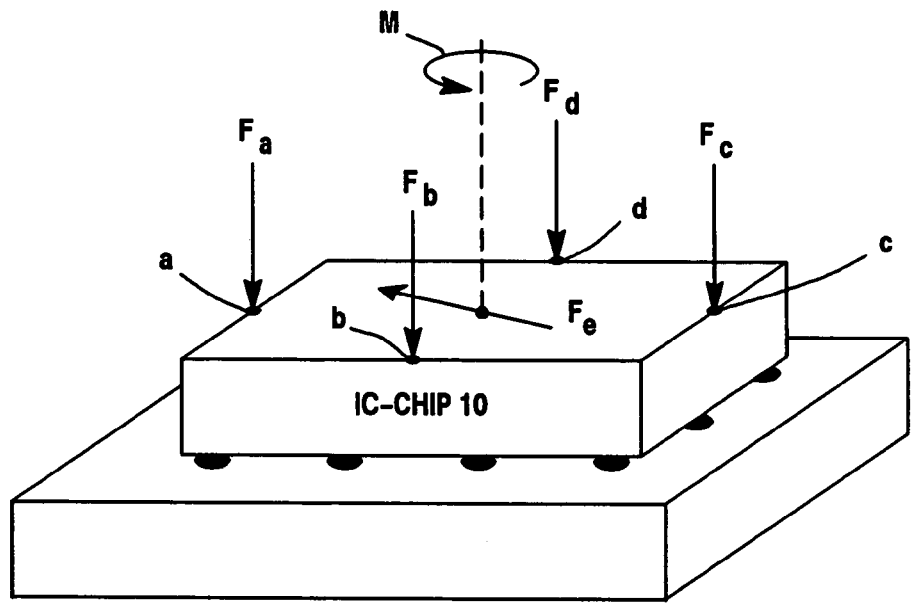
FIG. 7C shows the remaining three steps of an eight step process by which physical parameters are determined for the two coiled tubes in the heat-exchanger of FIG. 2.

To make the above calculation, the IC-chip 10 is assumed to have four hypothetical bumps on its contact surface at points "a", "b", "c", and "d". These bumps are located at the midpoint on each side of the contact surface, as shown in FIG. 7C.

Also to make the above calculation, the coiled tube sections 21a-1 and 21b-1 are assumed to exert the forces and moments on the evaporator 21 which were determined by their respective force/moment vector $FM_v$ from step 5. Further to make the above calculation, the gimbal spring 33 is assumed to exert a force on the evaporator 21 which is perpendicular to the contact surface of the IC-chip 10. That force is opposed equally by the four bumps at points a, b, c, and d.

All of the forces "$F_a$", "$F_b$", "$F_c$", "$F_d$", and "$F_e$", and the moment "M", are calculated by applying the following equations to the evaporator 21 and heater 20 of FIG. 4: $\Sigma F_x=0$, $\Sigma F_y=0$, $\Sigma F_z=0$, $\Sigma M_x=0$, $\Sigma M_y=0$, $\Sigma M_z=0$. In these equations, $F_x$, $F_y$, and $F_z$ respectively are all of the forces that occur parallel to the X, Y, and Z axis, and $M_x$, $M_y$, and $M_z$ respectively are all of the moments that occur around the X, Y, and Z axis.

After numerical values are calculated in step 6 for the moment M and the forces $F_a$, $F_b$, $F_c$, and $F_d$ and $F_e$, those values are compared to an acceptance criterion. This occurs in FIG. 7C as step 7.

Preferably, one part of the acceptance criterion is not met if any one of the forces $F_a$, $F_b$, $F_c$, and $F_d$ is negative. A calculated negative force indicates that at least part of the heater 20 has lifted off of the IC-chip 10.

Also preferably, a second part of the acceptance criterion is not met if the forces $F_a$, $F_b$, $F_c$, and $F_d$ are too far out of balance, since that would tend to increase the thermal resistance between the IC-chip 10 and the heater 20 in the area where the weaker forces occur. Preferably, each force $F_a$, $F_b$, $F_c$, and $F_d$ is at least one-fifth of the average value of $F_a$, $F_b$, $F_c$, and $F_d$. In more general terms, the force per unit area at any particular point between the heater 20 and the IC-chip 10 preferably is at least one-fifth of the average force per unit area between those two components.

Also preferably, a third part of the acceptance criterion is not met if $F_e$ is greater than $\mu(F_a+F_b+F_c+F_d)$, where "$\mu$" is the coefficient of friction between the IC-chip 10 and the heater 20. This ensures that the IC-chip 10 will not slip in the lateral direction on the heater 20.

Also preferably, a fourth part of the acceptance criterion is not met if M is greater than $\mu L(F_a+F_b+F_c+F_d)/3$. Here, "$\mu$" is the above coefficient of friction, and "L" is the length of the IC-chip 10 along its smaller side. This ensures that the IC-chip 10 will not slip in a rotational manner on the heater 20.

If all four parts of the above preferred acceptance criterion are not met, the physical parameters for the coiled tube sections 21a-1 and/or coiled tube section 21b-1, that were previously selected in step 1, need to be modified. Then, after the modified parameters are selected, all of the steps 2-6 are repeated to thereby determine new values for the moment M and forces $F_a$, $F_b$, $F_c$, $F_d$ and $F_e$. If these new values meet all four parts of the preferred acceptance criterion, the process of FIGS. 7A-7C ends. Otherwise, steps 1-7 are repeated over and over until all four parts of the preferred acceptance criterion are met. This is indicated in FIG. 7C as step 8.

One preferred embodiment of the present invention has now been described in detail. Next, various changes and modifications which can be made to this preferred embodiment, without departing from the gist of the invention, will be described.

As a first modification in FIG. 2, the central portion 21a-1 of the input conduit 21a and the central portion of 21b-1 of the output conduit 21b, can each be coiled into a cylindrical spring. Similarly, in FIG. 2, the central portion 21a-1 of the input conduit 21a and the central portion 21b-1 of the output conduit 21b can each be coiled into a spiral spring.

When the first modification is incorporated into FIG. 1, then as a second modification, the two tubes 21a and 21b can have different diameters with one tube being inside of the other tube. Preferably, the output tube 21b has the larger diameter since it needs to carry a gas at low pressure. Each end of the larger diameter tube can be covered with a cap that has two holes. The smaller diameter tube should extend in an airtight manner through one of the holes, and the other hole is a port to the larger diameter tube.

As a third modification, the central section 21a-1 and 21b-1 of each coiled tube can have any number of turns. Preferably however, the central sections 21a-1 and 21b-1 each have at least two complete turns, since the forces and torques which the coiled tubes exert on the input port and output port of the heat-exchanger 21 decrease as the total number of turns increase.

As a fourth modification, it may be possible to design around the preferred embodiment of FIG. 2 by not putting any coils in one of the two tubes 21a or 21b. For example, one of those tubes could possibly have a very long length and a very small diameter so that it will easily flex. But when the output tube 21b needs to pass the coolant as a gas at low pressure, the tube diameter needs to be large in order to keep the gas pressure low. However, the stiffness of a tube increases as its diameter increases, so the large diameter output tube will need to be coiled to prevent it from being too stiff.

As a fifth modification, in FIG. 2, the electric heater 20 can be deleted from the evaporator 21. With this modification, the evaporator 21 makes direct contact with the IC-chip 10.

As a sixth modification, in FIG. 2, the evaporator 21 can be replaced with a hollow heat-sink which passes a coolant in just the liquid state. With this modification, the liquid coolant flows into the heat-sink through the coiled input tube 21a, and the liquid coolant flows out of the heat-sink into the coiled output tube 21b.

Also, when the above sixth modification is incorporated, then as a seventh modification the electric heater 20 can be deleted from the heat-sink. In that case, the heat-sink will make direct contact with the IC-chip.

As an eighth modification, the mechanical assembly in FIG. 2 can be used to regulate the temperature of an IC-chip in an IC-module of the type where the IC-chip is covered with a lid. For that type of IC-module, the heater 20 simply presses against the lid instead of the IC-chip. The ends of the coiled tubes 21a and 21b again move as shown in FIGS. 3A and 3B.

Also, as a ninth modification, the acceptance criterion which is used in steps 7 and 8 of FIG. 7C can be modified to be any desired AND/OR combination of the four parts that are in the preferred acceptance criterion. For example, this modified acceptance criterion can be that just the second part AND the third part of the preferred acceptance criterion is met. As another example, this modified acceptance criterion can be that just one particular part of the preferred acceptance criterion is met.

Accordingly, it is to be understood that the present invention is not limited to just the details of the illustrated preferred embodiment, but is defined by the appended claim.

What is claimed is:

1. A mechanical assembly for regulating the temperature of an IC-chip in an IC-module comprising:
    a heat-exchanger having a first face for contacting a second face on said IC-module;
    a gimbal coupled to said heat-exchanger, which is configured to tilt and press said first face flatly against said second face, as said first and second faces are moved from a spaced-apart position to an engaged position at which said IC-chip temperature is regulated; and
    an output tube, coupled to an output port on said heat-exchanger, and having two ends configured to move relative to each other as said first and second faces move from said spaced-apart position to said engaged position;
    wherein said output tube is formed into a spring which is characterized by a stiffness matrix that is limited by a predetermined acceptance criterion.

2. A mechanical assembly according to claim 1 wherein said spring is sufficiently limited in stiffness to maintain said first face in contact with said second face, as those faces move from said spaced-apart position to said engaged position.

3. A mechanical assembly according to claim 1 wherein said spring is sufficiently limited in stiffness to induce a force per unit area at any particular point between said first and second faces, which is greater to or equal than one-fifth of the average force per unit area between those faces, as those faces move from said spaced-apart position to said engaged position.

4. A mechanical assembly according to claim 1 wherein said spring is sufficiently limited in stiffness to prevent any lateral slippage of said first face against said second face, as those faces move from said spaced-apart position to said engaged position.

5. A mechanical assembly according to claim 1 wherein said spring is sufficiently limited in stiffness to prevent any rotational slippage of said first face against said second face, as those faces move from said spaced-apart position to said engaged position.

6. A mechanical assembly according to claim 1 wherein said output tube is formed into a spiral spring.

7. A mechanical assembly according to claim 1 wherein said output tube is formed into a cylindrical spring.

8. A mechanical assembly according to claim 1 further comprising: an input tube, coupled to an input port on said heat-exchanger, and having two ends that move relative to each other as said first and second faces move from said spaced-apart position to said engaged position, wherein said input tube is formed into a spring which is characterized by a stiffness matrix that is limited by a predetermined acceptance criterion.

9. A mechanical assembly according to claim 8 wherein said output tube has a large diameter relative to said input tube which has a substantially smaller diameter.

10. A mechanical assembly according to claim 8 wherein said heat-exchanger includes an evaporator for said coolant, and said coolant in said input tube is in a liquid state whereas said coolant in said output tube is in a gas state.

11. A mechanical assembly according to claim 8 wherein said coolant in said output tube is at a low pressure and said coolant in said input tube is at a high pressure which is at least one-hundred psi more than said low pressure.

12. A mechanical assembly according to claim 8 wherein at least one of said tubes is formed as a cylindrical spring.

13. A mechanical assembly according to claim 8 wherein at least one of said tubes is formed as a spiral spring.

14. A mechanical assembly according to claim 8 wherein said input tube and said output tube have different diameters with one tube being inside of the other tube.

* * * * *

UNITED STATES PATENT AND TRADEMARK OFFICE
CERTIFICATE OF CORRECTION

| | | |
|---|---|---|
| PATENT NO. | : 7,373,967 B1 | Page 1 of 1 |
| APPLICATION NO. | : 10/879245 | |
| DATED | : May 20, 2008 | |
| INVENTOR(S) | : Tusutaniwskyj et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 780 days.

Signed and Sealed this

Fourth Day of January, 2011

David J. Kappos
*Director of the United States Patent and Trademark Office*